(12) United States Patent
Reid et al.

(10) Patent No.: US 7,656,914 B1
(45) Date of Patent: Feb. 2, 2010

(54) DIRECTLY-MODULATED DIODE LASERS WITH REDUCED OVERSHOOT

(75) Inventors: Benoit Reid, Laval (CA); Christopher Watson, Ottawa (CA)

(73) Assignee: Bookham Technology plc, Towcester, Northhamptonshire (GB)

( * ) Notice: Subject to any disclaimer, the term of this patent is extended or adjusted under 35 U.S.C. 154(b) by 176 days.

(21) Appl. No.: 12/027,413

(22) Filed: Feb. 7, 2008

Related U.S. Application Data (60) Provisional application No. 60/890,124, filed on Feb. 15, 2007.

(51) Int. Cl.
*H01S 3/10* (2006.01)
*H01S 3/13* (2006.01)
*H01S 3/00* (2006.01)

(52) U.S. Cl. ............... 372/26; 372/29.013; 372/29.014; 372/38.08

(58) Field of Classification Search .................. 372/26, 372/29.013, 29.014, 38.08
See application file for complete search history.

(56) References Cited

U.S. PATENT DOCUMENTS

| 4,669,086 A | 5/1987 | Kaede et al. |
| 5,502,741 A | 3/1996 | Carroll et al. |

OTHER PUBLICATIONS

"Faster modulation of single-mode semiconductor lasers through patterned current switching: numerical investigation", N. Dokhane and G.L. Lippi, IEE Proc. -Optoelectron, vol. 151, No. 2, Apr. 2004, pp. 61-68.
"Improvement of the Direct Modulation Behavior of Semiconductor Lasers by Using a Holding Beam", G. Morthier, et al., IEEE Photonics Technology Letters, vol. 16, No. 7, Jul. 2004, pp. 1616-1618.
"Shaping Current Waveforms For Direct Modulation of Semiconductor Lasers", Lucas Illing et al., IEEE Journal of Quantum Electronics, vol. 40, No. 5, May 2004, pp. 445-452.

*Primary Examiner*—Armando Rodriguez
(74) *Attorney, Agent, or Firm*—Marks & Clerk (57) ABSTRACT

An optical signal is produced from a direct modulation resonant cavity device, such as directly-modulated diode laser having an electrode divided into multiple sections. Each section is driven with an electrical waveform such that a time delay is introduced between sections so as to ensure that the different sections reach their peaks at slightly different times.

30 Claims, 8 Drawing Sheets

DIRECTLY-MODULATED DIODE LASERS WITH REDUCED OVERSHOOT

CROSS REFERENCE TO RELATED APPLICATION

This application claims the benefit under 35 USC 119(e) of prior U.S. application No. 60/890,124, filed Feb. 15, 2007, the contents of which are herein incorporated by reference.

FIELD OF THE INVENTION

This invention relates to the field of optical communications, and in particular to direct modulation resonant cavity devices, such as a resonant cavity light emitting diode (LED) or a direct modulation semiconductor diode laser (DML) of the Fabry-Perot type or distributed-feedback (DFB) type. Such devices are typically used for generating optical signals in communication systems.

BACKGROUND OF THE INVENTION

In the discussion of the prior art, reference will be made in particular to a DML, which is one type of direct modulation resonant cavity device and which is exemplary of direct modulation resonant cavity devices in general.

The output of a DML must be modulated in order to generate an output signal that is capable of transmitting data over an optical communications medium. The modulation, which involves varying the intensity of the optical output, can be either digital or analogue. In the digital case, data is transmitted in the form of symbols, which are represented by different states of the optical output. In the simplest case, a symbol represents a single bit, in which case the optical output changes from a high to low state to represent logical 1's and 0's.

The output of a laser is commonly evaluated by means of an "eye diagram", which is created by taking the time domain laser output level and overlapping the traces on an oscilloscope for a certain number of symbols using the data rate to trigger the horizontal sweep. From the eye diagram, properties such as overshoot, wherein the output level exceeds the nominal high level, can be determined. The overshoot is due to the dynamics of the laser being sub-critically damped and is responsible for "eye ringing", which may cause the shape of the output "eye" pattern to be modified such that it does not fit within the "template" of acceptable performance used to ensure that the signal is capable of being decoded after transmission along an optical fibre.

Figure 1:
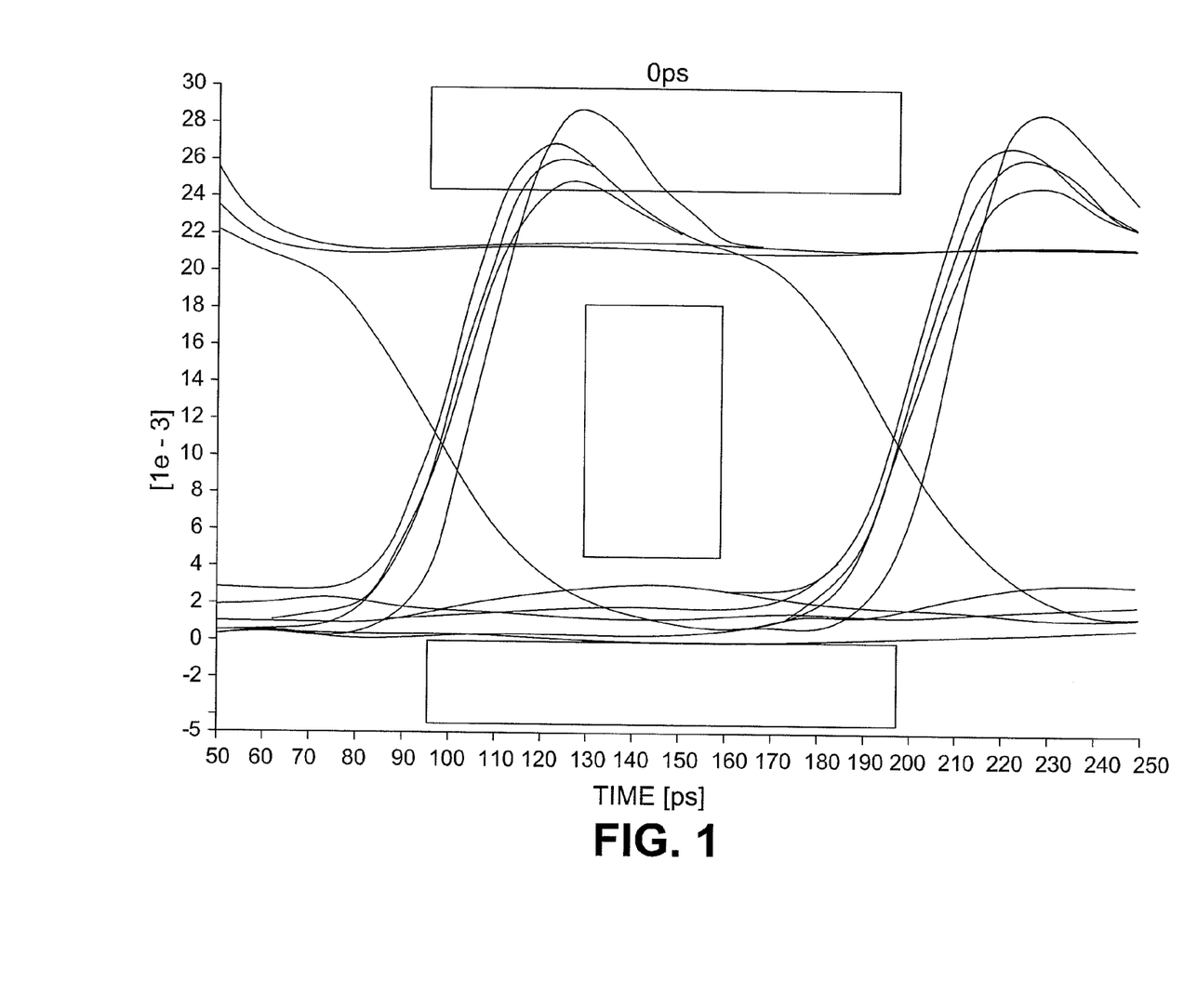
FIG. 1 shows an eye diagram that has failed to be in compliance with a SONET mask due to overshoot of the transitions from logical 0's to 1's.

At high bit rates, for example 10 Gbit/s, the quality of an optical waveform sent down the optical fiber is degraded because of ringing on the logical 1's and the logical 0's. A major issue is overshoot on the rising edge during the transition to the logical 1 level. The optical waveform generated by the laser has to meet very stringent specifications. For telecom links part of the specification is described by a mask (for example the SONET mask) which the waveform should not encroach on. A schematic example of a failed mask is shown in FIG. 1. Overshoot in the logical 1 state results in the waveform encroaching on the mask. This is a long-standing problem that significantly restricts the usefulness of a DML, particularly for applications involving high speed digital or analogue modulation. Amplitude modulation (both digital and analog) is advantageous over alternative frequency or phase modulation schemes in that it is possible to avoid the need for a separate modulator. The amplitude of the light generated by the laser can be modulated directly by an electrical drive signal.

Ringing happens for all lasers, but on a different time scale depending on the type of lasers. Damped periodic oscillations are caused by an intrinsic resonance in the non-linear laser system. In operation a laser is biased above the lasing threshold by being driven to create a population inversion of electrical charge carriers. When the drive current increases, for example in the transition from a 0 to a 1 optical output of a binary system, the degree of electrical charge carrier inversion increases. This increase in the degree of electrical charge carrier inversion is accompanied by an increase in the optical gain in the optical cavity of the laser to such a point that lasing occurs and the light intensity in the cavity increases rapidly to a high level. The high light intensity depletes the carrier density through stimulated emission, which in turn decreases the optical gain and thus the light intensity. The reduced light intensity will then allow the electrical carrier density to increase again, thus commencing another cycle of the optical power within the laser. These cycles that occur when there is a change in the drive current are damped, and the length of time that the laser takes to stabilise depends on factors such as the driving conditions and the laser design. At 10 Gb/s and above it is extremely difficult to remove all the cycles, and often the first cycle remains. This appears as an overshoot on the rising edge of the eye pattern. At lower frequencies, such as 2.5 Gb/s and below it is much easier to avoid the overshoot because the laser may be perturbed more slowly. The speed of the rising edge of the electrical drive signal is critical.

Damping is not an easy property to modify by design. Damping is increased by a larger photon density inside the optical cavity, by a larger gain saturation or by longer carrier transport time. Unfortunately these parameters cannot be readily modified to improve the laser performance.

To improve the photon density significantly the laser has to be driven harder (with larger drive currents), which tends to decrease the extinction ratio between the logical 1 and the logical 0 states (typically 10 dB). This degrades system performance. It is also possible to modify the cavity coatings or grating strength (in the case of a DFB laser), but the increase in the photon density is usually small, and in the case of a larger grating strength can lead to other problems such as a decrease in the single-mode yield.

It has been suggested that gain saturation can be modified slightly by choosing suitable materials in the optically active region of the waveguide supporting the propagation of the optical mode in the diode laser. Unfortunately, reported variations in gain saturation are small and are not easily translatable into different material systems or different operating wavelengths since the fundamental physical mechanism behind gain saturation in commercial diode lasers is still not fully understood.

There is some evidence that carrier transport time can be increased in diode lasers by thickening the optically active region of the waveguide core. However, in commercial diode lasers comprising multiple quantum well (MQW) active layers the understanding of how much the carrier transport time can be varied in this way is still incomplete. Moreover, simulations indicate that too long a transport time leads to signal patterning or inter-symbol interference (ISI) and a large increase in chirp, or frequency excursion. This also strongly limits performance at higher bit rates, such as 20 Gbit/s or 40 Gbit/s, and longer system reaches, such as greater than 20 km at 10 Gbit/s.

The possibility of modifying the laser drive current waveform to improve the optical signal has been investigated. In an example a pre-pulse is used before the 0 to 1 transition in the current waveform. However, such an approach requires very fast and special laser drivers in order to realize such waveforms. Moreover different drivers are needed for different lasers, or the driver would be required to have some tuneable characteristics. That means that the laser driver cost would probably be too prohibitive to use. Examples of such an approach can be found in: L. Illing and M. B. Kennel, *IEEE Journal of Quantum Electronics*, vol. 40, no. 5, p. 445-452 (2004); and N. Dokhane and G. L. Lippi, *IEE Proceedings-Optoelectronics*, vol. 151, no. 2, p. 61-68 (2004).

A different approach consisting of injecting light into the directly-modulated laser from a high power continuous wave (CW) diode laser with a wavelength set at transparency (i.e. the wavelength at which there is neither gain nor loss) was also demonstrated in: G. Morthier and B. Mocyersoon, *IEEE Photonics Technology Letters*, vol. 16, no. 7, p. 1616-1618 (2004). This approach is not very attractive because it complicates significantly the packaging of the laser, requiring an optical alignment between the two laser chips. It also significantly increases the power dissipation by the device and would be difficult to use for uncooled operation.

In order to explain the significance of the prior art, it will first be useful to introduce the concept of chirp. Chirp is a change in frequency of the light output as a laser is modulated, which results from differences in the laser optical cavity length under different drive conditions, and at the point when the drive condition changes. Three different types of chirp can be considered.

Adiabatic chirp is a stable difference in the lasing frequency for a 1 compared with a 0, arising from a difference in equilibrium electrical carrier density between the two modulation states. This type of chirp exists and is invariant over modulation frequencies ranging from DC up to >100 Gb/s.

Thermal chirp corresponds to temperature induced frequency changes resulting from fluctuations in power dissipation in the laser as the device is modulated. This type of chirp is most significant at low modulation frequencies and typically will not be observed above 100 Mb/s.

Transient chirp is an unstable fluctuation in the lasing frequency caused by a resonant oscillation between the electrical carrier density and the optical photon density which occurs when the carrier injection and/or the optical power within the laser cavity change. This type of chirp is dominant at modulation rates close to the laser relaxation oscillation frequency which, depending on the design of laser, can vary between 1 and 20 GHz. For a very fast switching of the electrical drive signal (typically at higher modulation rates), this can be the dominant effect in bandwidth broadening.

U.S. Pat. No. 4,669,086 to Kaede teaches of cancelling the chirp, or instantaneous frequency deviation, induced when directly modulating a laser at moderately low frequencies. In this method a control signal, which is a phase-shifted and attenuated version of the modulation signal, is applied to a separate electrode on a separate section of the laser cavity. This section is biased below (the lasing) threshold and because of this the carrier density, and thus the refractive index, is strongly modulated by the control signal. Above threshold the carrier density is approximately "pinned" and varies less with modulation current. The choice of phase shift between control and modulation signals is such that the index change in the control section is in antiphase to the index change generated in the main modulation section of the laser. If the product of the index change and length for the two sections are properly balanced (equal and opposite) then the net optical frequency of the laser under modulation will be stable. However, this method is only suitable for low frequency modulation because as the modulation frequency exceeds the differential carrier lifetime of the laser the modulation response of the carrier density rapidly reduces. The differential carrier lifetime of a typical directly modulated laser at biases below threshold would tend to be in the 1-2 ns range and consequently this approach would be limited to modulation frequencies less than around 0.5-1 GHz. In addition, the time constants associated with carrier transport and carrier recombination mechanisms produce a modulation frequency dependent phase relationship between the control current and the carrier density in the control section. This will limit this approach to narrow band analogue modulation or low data rate digital modulation applications.

Kaede is concerned with optically modulating the laser output with a drive signal that comprises an amplitude modulated electrical carrier signal, from driver 301, and shown in Kaede FIG. 3*a*. In such prior art a high frequency substantially sinusoidal electrical carrier is amplitude modulated with a data signal at a much lower data rate. Each bit corresponding to many cycles of the carrier. This difference in data rate and carrier frequency is necessary, so that the bandwidth of the data signal is less than the carrier frequency (otherwise data is lost for example).

When the optical signal is detected the output electrical signal is again an amplitude modulated (AM) carrier, with the data being encoded in the amplitude. Consequently the shapes of the individual periods of the carrier are relatively unimportant, so long as the amplitude relates to that of the data signal originally used to encode the carrier. Thus Kaede cannot be said to teach a method of improving the quality of amplitude modulation that is relatively unimportant to the device of Kaede, and in particular Kaede does not address the phenomenon of overshoot.

U.S. Pat. No. 5,502,741 to Carroll teaches a method of achieving independent control of amplitude or frequency modulation, which are undesirably interrelated in a conventional, single section DFB laser (or Fabry-Perot laser—i.e. a laser with no grating). This patent describes a two section top electrode that is driven in a "push-pull" drive configuration, in which a second section is driven by the same signal waveform as a first section, after having been inverted and DC shifted. This approach decreases the chirp (rate of wavelength change), but its impact on damping is unknown. This approach is difficult to implement because the necessary signal driver does not presently exist as an off-the-shelf product, and would be prohibitively expensive as a custom-made product.

Carroll is concerned with the use of an anti-phase modulation signal driving scheme. Carroll discloses a design in which both parts of the device lase, although each section may not necessarily lase continuously. Further, the intention of Carroll is also to control the total photon population, and maintain it constant: "the anti-symmetric modulation of current operates in a push-pull mode to keep substantially constant the total photon population within the laser". Carroll teaches that the laser should be substantially longitudinally symmetric (along the waveguide).

Another set of designs of multiple section lasers is known where both sections are driven in DC, for tunable lasers or to generate microwave signals for examples. Yet another set of designs involves the so-called "gain-lever" effect, in which one section is DC biased and another section is modulated.

SUMMARY OF THE INVENTION

The invention provides a method of driving a direct modulated resonant cavity optoelectronic device, such as a semiconductor laser, such that it is suitable for high bit rate operation with improved performance with respect to the performance mask, and which in particular provides a method of decreasing the overshoot on the 0 to 1 transition.

Accordingly one aspect of the invention provides a method of producing an amplitude modulated optical output signal from a directly modulated resonant cavity optoelectronic device divided into successive sections, comprising applying respective electrical drive signals derived from a common input signal to said successive sections to produce components of the optical output signal, said sections being biased above a lasing threshold for the device; and the electrical drive signals having overlapping waveforms with a time delay introduced therebetween such that such that the components of the optical output signal reach a peak intensity at different times to suppress amplitude overshoot and amplitude oscillation during transitions from a low to high output level. The input signal is typically digital, in which case the low output state normally represents a 0 and the high output state normally represents a 1, although it could be analogue, in which case the transitions are non discrete.

Another aspect of the invention provides a direct modulation resonant cavity optoelectronic device, comprising an optically active region; an electrode divided into at least two separate electrode sections for applying respective electrical drive signals derived from a common input signal to said optically active region; and a drive arrangement configured to apply said electrical drive signals with overlapping waveforms to said at least two electrode sections, said overlapping waveforms having a time delay therebetween such that the components of the optical output resulting from the waveform applied to each electrode section reach a peak intensity at different times to suppress amplitude overshoot and amplitude oscillation during transitions from a low to high output level.

The electrical drive signals may be applied between the respective electrode sections and a common ground electrode.

The time delay should normally be fixed, although a control may be provided to adjust the delay in order to compensate for manufacturing variations between different devices.

The device can be of the same design and geometry as a normal single section optoelectronic device, but with one electrode comprising multiple, separate electrode sections. The drive signals are applied between two electrodes on opposite sides of the optically active region. One of the electrodes is typically a common ground electrode. Either or both of the electrodes may be comprise multiple electrode sections.

The multiple electrode sections may be of the same length or of different lengths. Electrical isolation may be provided between the multiple electrode sections and can be achieved by methods such as ion implantation or etching of the semiconductor material between the electrode sections. In the particular case of DFB lasers, the gratings are preferably uniform in the different sections for ease of fabrication. Alternatively, the gratings in the different sections may be different.

The inventive method can be used to complement other design approaches. The multi-section with fixed delay design could in principle be applied to any DFB. However, as a means of improving amplitude modulation, as illustrated by the optical eye (a measure of the quality of the amplitude modulation), of FIG. 1, it is particularly beneficial to high modulation rate systems. Below 2.5 Gb/s the benefit is likely to be small because such devices will only need to be driven with a signal that has a relatively slow rise time, so the optical intensity output of a device with a top electrode comprising only a single electrode section will follow the drive signal to an acceptable degree. With a slow rise time, the laser's optical carrier inversion will be much smaller and less significant than for a more sudden change.

The invention is thus primarily applicable to higher modulation rate schemes, e.g. 1 Gb/s and above; preferably 2.5 Gb/s and above; and yet more preferably 10 Gb/s and above if necessary. Although there is nothing technically that would stop one driving the more complex and expensive device of the present invention with an AM carrier signal there would be no particular advantage to doing so.

Yet another aspect of the invention provides a direct modulation laser comprising a carrier; a laser chip provided on said carrier, said laser chip including an electrode divided into at least two separate electrode sections for applying respective electrical drive signals derived from a common input signal to an active region of the laser to generate components of an optical output; transmission lines on said carrier for applying the electrical drive signals to said respective electrode sections; and said transmission lines being configured to introduce a time delay between the electrical drive signal applied to one of said electrode sections and the electrical drive signal applied to the other of said electrode sections whereby the components of the optical output resulting from the drive signal applied to each section reach a peak intensity at different times to suppress amplitude overshoot and amplitude oscillation during transitions from a low to high output level.

In one embodiment the invention provides a multi-section DFB (distributed feedback) laser wherein a grating is written along the path of the optical mode to govern the lasing wavelength with a time delay between some of the driven sections. While it can be expected that each section will have a modulation response that is similar to that of a conventional single section DML, by providing a time delay between different sections of the laser, it can be ensured that the sections reach their individual peaks at different times.

The optical gain produced in the different sections may be unequal, due to attenuation of the drive signal to one or more section, different sizes of the sections, or differences in electrode design, such as size and area.

In a simple embodiment the laser comprises two sections. Potentially there could be further advantages to the laser comprising more than two sections (e.g. three sections), albeit at the cost of increased manufacturing complexity.

In one embodiment the invention is applied to a 10 Gbit/s DML. In such a device the preferred delay is of the order of 40% of a bit period, i.e. 40 ps. Such a time delay can be created by length inequalities (1 mm corresponds to approximately 10 ps delay) in the tracks on the carrier to which the semiconductor chip is attached and which provide transmission taking the drive signals to the electrode sections. For devices operating at much higher data speeds the time delay could be sufficiently small that the track inequality could be monolithically integrated onto the laser chip.

In the case of a DFB laser, the grating pitches in the different sections may be either the same or different. Alternatively, the gratings may have a pitch that varies along the length of the laser.

The electrode can be divided into two sections, or more than two electrode sections. The electrode sections can be identical or different and may be electrically isolated. Methods by which electrical isolation may be achieved between the electrode sections include by ion implantation or semiconductor etching.

The electrode sections may have different dimensions, different areas, different geometries, or be made of different materials, such that different currents, and consequently different optical gains, are provided in the corresponding different sections of the laser.

The multiple waveforms applied to the different sections may be identical, with the exception of the time delay, or they may also have different amplitudes.

BRIEF DESCRIPTION OF THE DRAWINGS

The invention will now be described in more detail, by way of example only, with reference to the accompanying drawings, in which:—

DETAILED DESCRIPTION OF EMBODIMENTS OF THE INVENTION

It is important to achieve high quality, low distortion amplitude modulation as well as low laser chirp when using directly modulated lasers in digital high bit rate dispersion limited systems. In such systems a low distortion amplitude waveform will produce good receiver sensitivity at low fibre reaches while the presence of low chirp will help sustain the quality of the amplitude waveform as it propagates down the fibre and experiences chromatic dispersion. In loss limited applications (where chromatic dispersion is negligible) the most important attributes of the directly modulated laser are the quality of the amplitude waveform and the launched power into the fibre. For loss limited digital applications chirp reduction, or modulated frequency excursion reduction, is not particularly important. In accordance with embodiments of the invention, a multi-section direct modulation optoelectronic device is driven in such a way as to provide improved quality of amplitude modulation.

Embodiments of the invention suppress the amplitude overshoot and amplitude oscillation when a directly modulated laser transitions from a '0' state to a '1' state, that is the output of the laser goes from a low state to a high level. In a high data rate digital system, when a conventional laser undergoes such a transition, the amplitude will exhibit ringing oscillations which can sustain over time periods equivalent to a few bit periods. The methods in accordance with the present invention do not attempt to stabilise the laser optical frequency although the suppression of the intensity overshoot and ringing will result in a reduction of transient chirp, which will in turn enhance the system reach for dispersion limited digital applications.

The two (or more) laser sections should normally be modulated above threshold. It should be noted that when the output of the laser is an optical signal zero, the laser output does not actually switch off completely, but is typically operated just above the lasing threshold, at a low level. The data signal actually modulates the device between just above ('zero') and significantly above ('one') the lasing threshold. Ringing occurs at the falling edge at the start of a zero, but typically has a much longer relaxation oscillation frequency (e.g. three or four times longer than at the rising edge).

Figure 7A:
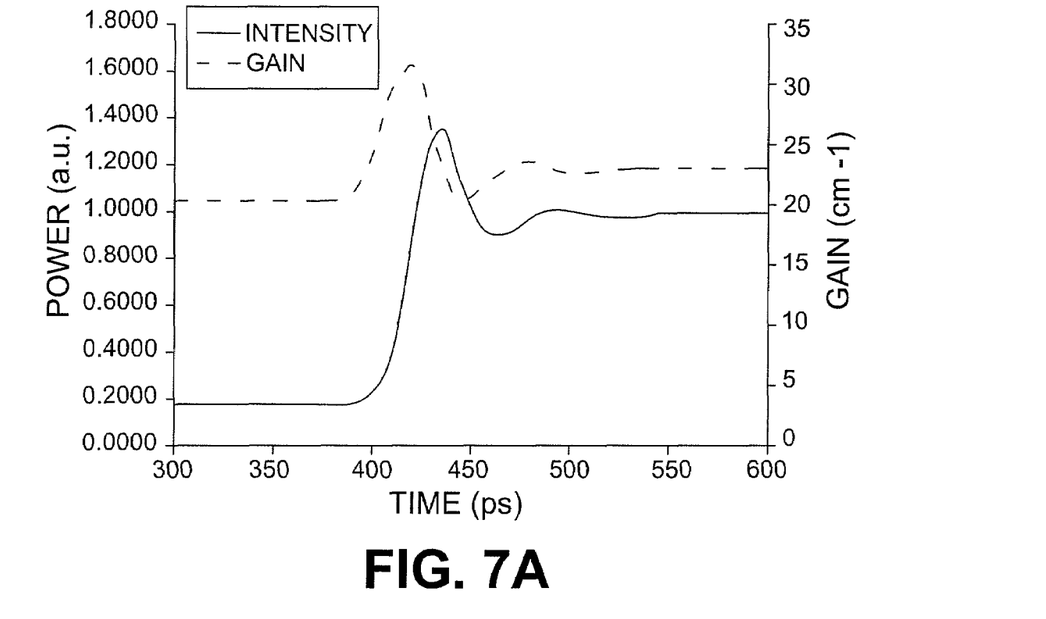
FIG. 7a: shows the intensity and gain transient during 0-1 transition modulation of a single section laser.

In order to enhance the understanding of the invention, it will be helpful to describe the dynamics at play when a conventional single section laser is modulated between states both of which are above the laser threshold condition. As the laser transitions from a '0'/low level state to a '1'/high level state a resonant exchange of energy between charge and photon reservoirs in the device will occur, leading to oscillations in the laser output power which dampen out over time. During such a transition, as the current climbs from the '0' state to the '1' state, the charge carrier density injected into the laser active region exceeds that required to maintain the threshold optical gain of the laser (optical gain is directly related to the number of available electron-hole carrier pairs) and this surplus of gain creates a rapid increase in the stimulated emission rate (i.e. a rapid increase in optical power). In turn the high rate of stimulated emission creates a rapid depletion of charge carrier density in the laser active region, which then acts to reduce the optical gain and hence reduce the optical power. The reduced optical power then allows the charge carrier density to increase again and so the cycle begins anew. The periodicity of the relaxation oscillation and the rate at which the oscillation dampens out is related to laser cavity gain, loss and geometric parameters. FIG. 7a illustrates the oscillation in optical power and optical gain as a device is switched from a '0' state to a '1' state (note that both states are above the lasing threshold).

Figure 7B:
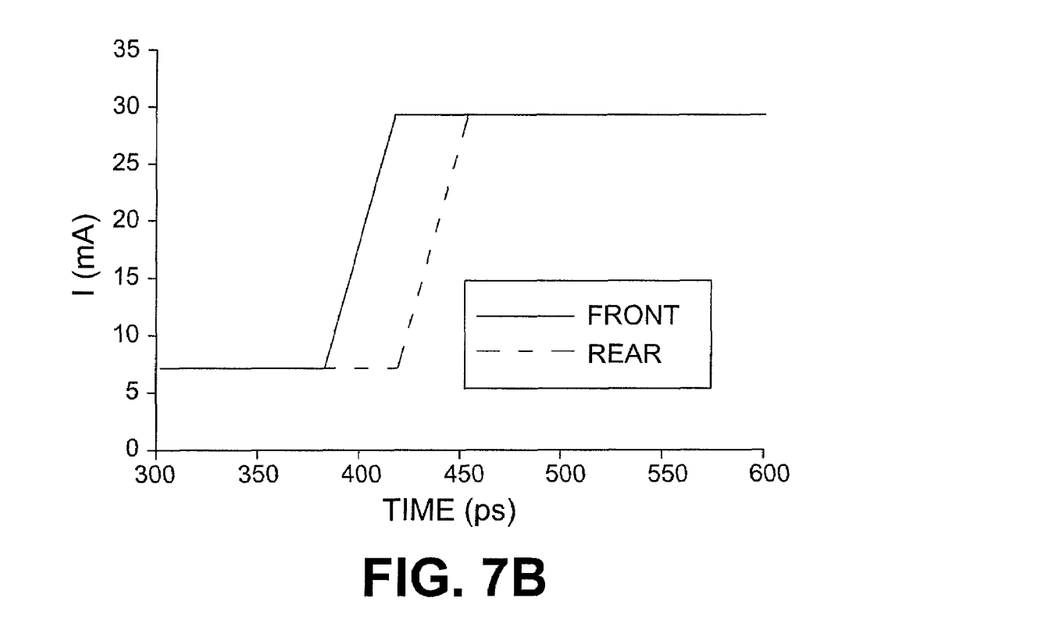
FIG. 7b shows the drive current 0-1 transitions for a two section laser.
Figure 7C:
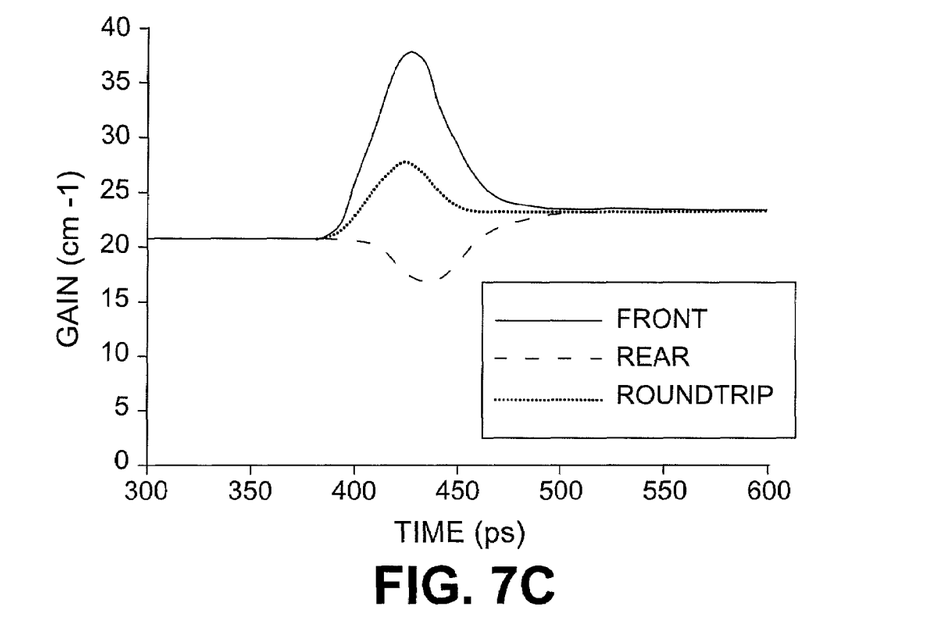
FIG. 7c shows the gain transients in a two section laser showing over and under-shoot in the front and rear sections.

In a two section laser, the photon-charge energy exchange resonance in each section can be used to critically dampen the amplitude response of the device. If such a device is driven as indicated in FIG. 7b, where a delay is introduced between 0-1 transitions for the front and rear section injection currents, the gain overshoot in the front section is at least partially compensated by a gain undershoot in the rear section. This is illustrated in FIG. 7c.

The gain transient behaviour shown in FIG. 7c can be explained as follows. As the front section begins to ramp up in drive current the rear section is still held at the '0' state injection current. During this period of time the charge carrier density, and hence the gain, will increase in the front section producing a rise in the rate of photon generation by stimulated emission. The optical mode, now containing a high density of photons, propagates into the rear section during each round trip of the laser cavity and produces a depletion of charge in the rear section. This depletion of charge occurs because the current in the rear section does not provide a high enough rate of charge injection necessary to sustain the increased stimulated emission rate produced by the larger photon density now in the mode. The resulting gain undershoot in the rear section acts to suppress the magnitude of the round trip gain overshoot and hence the amount of optical power overshoot.

Figure 7D:
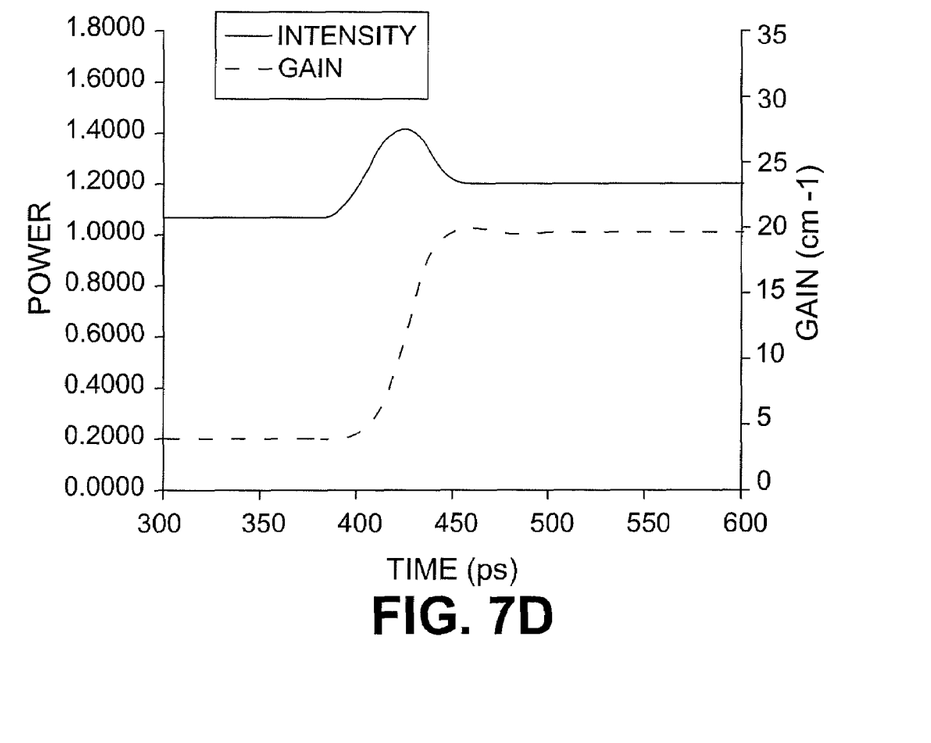
FIG. 7d shows the intensity and gain transients for a two section laser during the 0-1 transition modulation of a laser with multiple top electrode sections.

If the delay between the two section modulation currents is suitably chosen then as the gain in the front section falls (due to the overshoot in photon density using up charge carriers and reducing the carrier density) the gain in the rear section increases (due to the increase in rear section drive current) which acts to suppress the undershoot in optical power. The "gain ballasting" between the front and rear sections thus acts to significantly dampen the relaxation oscillations of the laser under modulation. This is illustrated in FIG. 7d which shows the intensity and gain transients of a two section laser, which apart from the delayed stimulation between sections is identical to the laser used to generate the eye diagram shown in FIG. 1.

Figure 2:
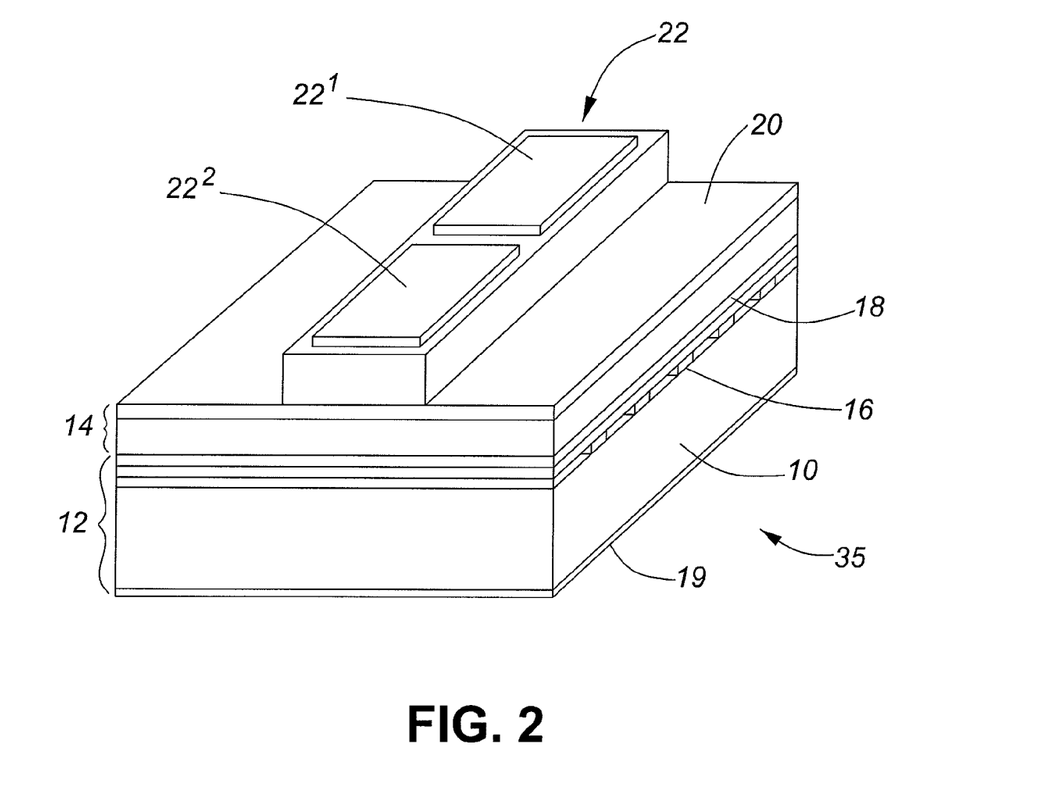
FIG. 2 is a schematic illustration of a distributed-feedback directly-modulated laser with the top electrode comprising two electrode sections.

A specific embodiment of the invention will now be described with reference to FIG. 2. The DFB DML chip 35 illustrated in FIG. 2 comprises a substrate 10 with n-doped cladding layers 12 and p-doped cladding layers 14. An optically active region 18 is sandwiched between the n-doped and p-doped cladding layers 12, 14.

A ground electrode 19 is provided on the bottom of the substrate 10. The ground electrode 19 can be a common electrode or it can be split into multiple sections.

The n-doped cladding layers 12 include Bragg grating layer 16 (which may alternatively be provided in the p-cladding layer 14 or active region 18). The p-doped cladding layers include etch stop layer 20. In the case of a Fabry-Perot DML, the design is similar to that illustrated in FIG. 2, but without the grating layer 16. The basic design and geometry of the laser is consistent with direct modulation lasers known in the art and features, such as the biasing circuit and any associated electrodes have been omitted for clarity. A typical DFB laser is described in Tunable Laser Diodes, by Ammann and Buus. ISBN 0-89006-963-8, the contents of which are herein incorporated by reference. DFB lasers are described in detail in section 3.4.

In accordance with the principles of the invention the laser includes top electrode 22, split into multiple, in this case two, electrode sections $22^1$, $22^2$, for applying separate drive signals in the form of drive currents 27, 28 to the optically active region 18. The drive signals preferably have similar digital waveforms but with a time delay.

Figure 3:
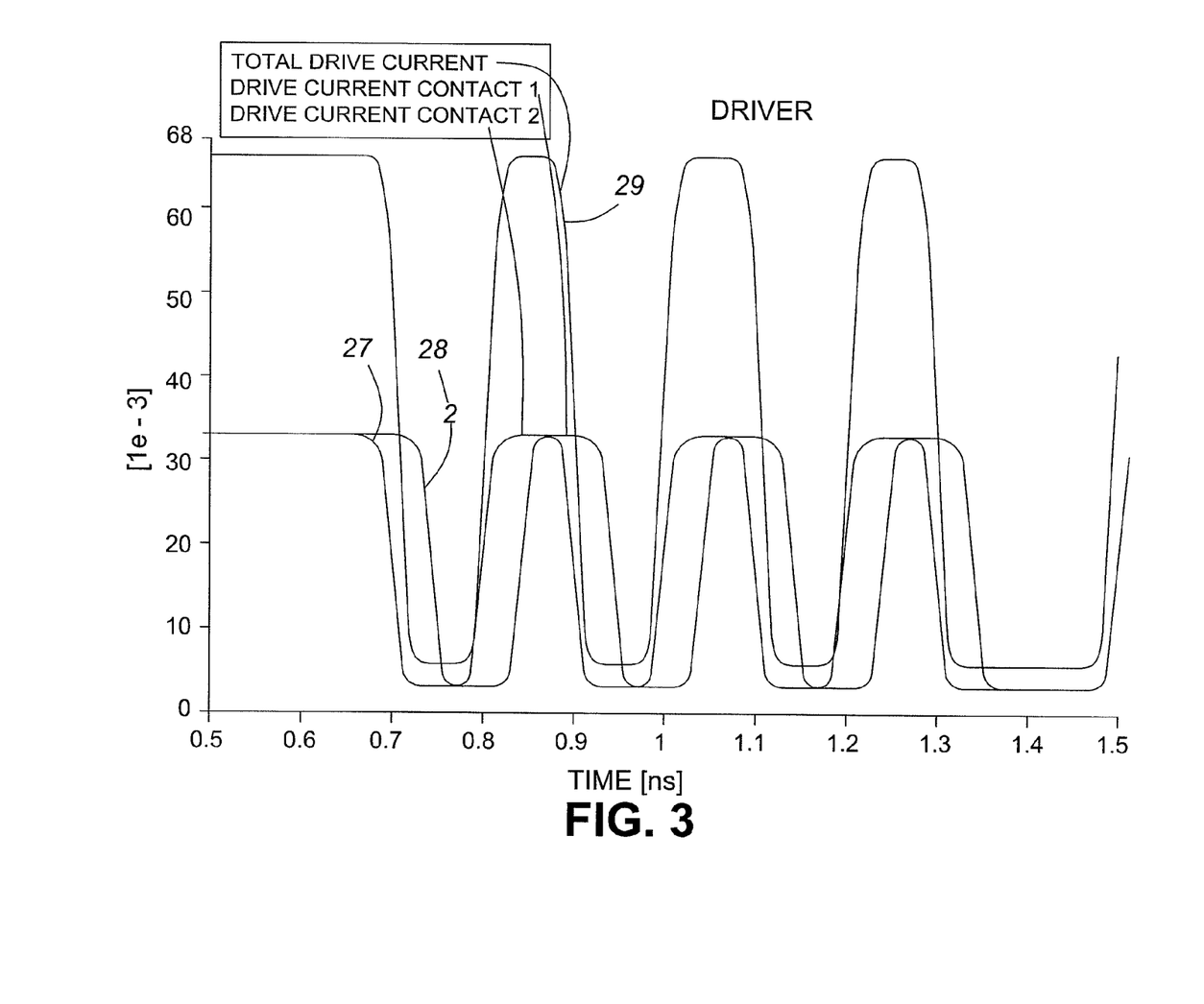
FIG. 3 shows an example of drive current waveforms for a two section device with a 40 ps delay.

The drive currents 27, 28 are presented in FIG. 3 in the case of a two electrode section device, together with the corresponding total drive current 29 that is supplied to the carrier on which the device is mounted. The drive current waveforms are applied between the respective electrodes $22^1$, $22^2$ and the common ground electrode 19 in this embodiment. In an alternative embodiment, the ground electrode 19 could be split instead of, or, as well as, the top electrode 22. The important point is that different sections of the device are driven in such a way that the components of the optical output of the laser originating from each section, or drive current, reach a peak intensity at different times with a fixed delay between them.

Figure 4:
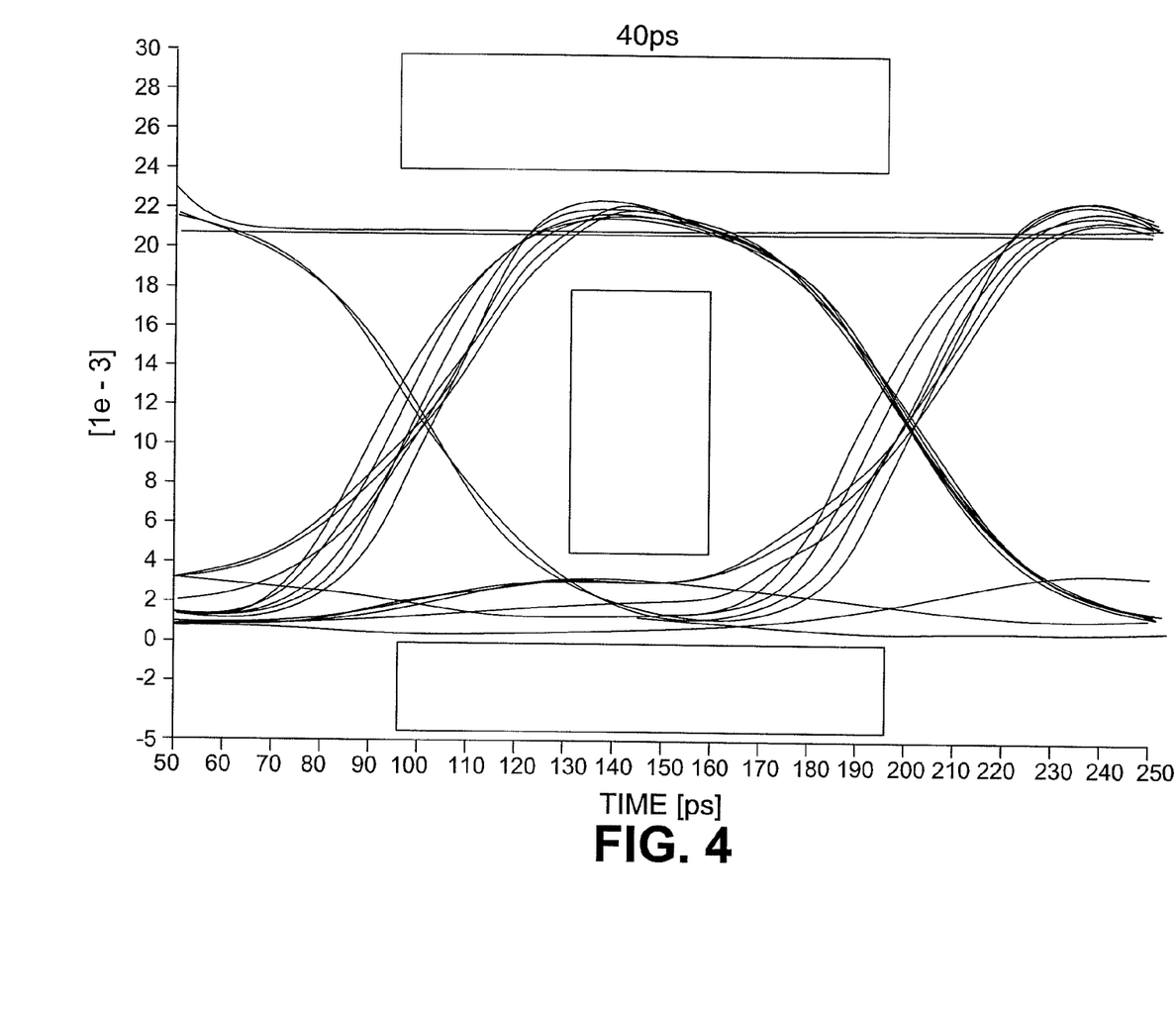
FIG. 4 shows an example of an eye diagram that is in compliance with a SONET mask.

The time delay between the current waveforms is set to a fraction of the bit period so as to optimize the eye diagram and mask margin of the generated optical waveform, as is illustrated in FIG. 4. The mask margin is the clearance of the eye diagram from the mask described in the telecom specifications. The optical waveform in the eye diagram of FIG. 4 is generated by using the same laser design used to generate the diagram shown in FIG. 1, but with the total drive signal split equally between two equally sized electrode sections, and with the drive signal to one electrode section being delayed by 40 ps with respect to the other. In this example, the device is a 300 micron cavity DFB laser with a grating strength, kL, of 1.5. The total drive current has a peak-to-peak amplitude of 60 mA, with a 36 mA drive signal split equally between two electrode sections.

In an alternative embodiment the amplitude of the drive signals to the two electrode sections may also be made different, for example by passing one of the drive signals through an attenuator, so as to further enhance the laser performance. The application of different signals to the different sections allows a further degree of control over the shape of the optical output due to their combined drive signals.

To a first approximation, for equal sections of the top electrode, the method in accordance with present invention can be considered as providing two half-height contributions (from the drive signals shown in FIG. 3), where the overall optical output results from adding the second drive signal to the first around the time that the first one has peaked. By the time the second drive signal peaks, the first drive signal has decayed slightly, thereby reducing the level of the highest peak that the combined drive signal produces.

The extra optical output due to the second signal can be used to compensate for the fractional decrease that occurs after the first signal has peaked, which may require the second contribution to be smaller than the first, for example.

In practice, there is some interaction because the optical power in the cavity from the first drive signal affects the response that the second drive signal produces. The actual system is more complex than would be implied by simply adding together two independent effects, but the principle remains the same.

Figure 5:
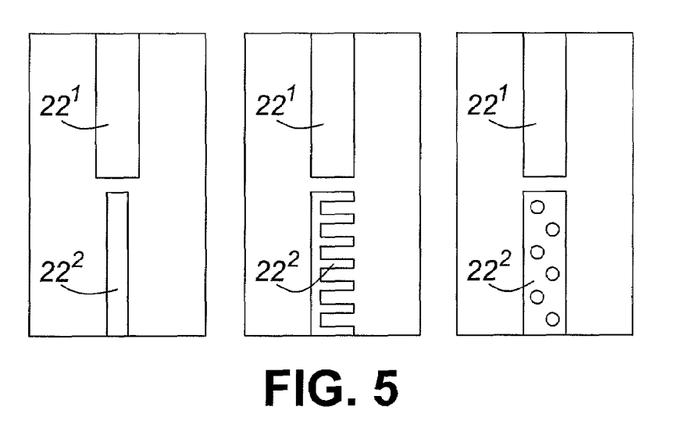
FIGS. 5a to c are schematic illustrations of examples of top electrode geometries used to achieve different current waveform amplitudes in different sections of a laser.

In another embodiment, the shape of the laser electrode sections can be modified to change the series resistance through the corresponding section of the laser and thereby to change the amount of current being injected into the electrode section. One example employs non-identical electrode section lengths. Electrode thickness and metal composition can also be varied. Further examples of this embodiment are depicted in FIGS. 5a to 5c. In FIG. 5a, electrode section $22^2$ is narrower than the electrode section $22^1$. In FIG. 5b, the electrode section $22^2$ is comb-shaped, and in FIG. 5c, the electrode section $22^2$ has a series of holes. Other designs will be apparent to one skilled in the art of DML design.

In another embodiment of the invention, the laser electrode sections are identical and the drive current amplitudes are set by using RF circuitry, which may be provided on the ceramic carrier 37 to which the chip is bonded. In this embodiment the RF circuit could contain a power splitter 30 (which may or may not be an equal power splitter) and a delay line 32 as illustrated schematically in FIG. 6a. The drive signals with a fixed delay between them are generated by a driver circuit 40, which receives a common input amplitude modulation signal 41. The modulation signal could be either analog or digital. In the latter case it would represent a sequence of 1's and 0's, where 1's correspond to a high output state and 0's correspond to a low output state.

Figure 6A:
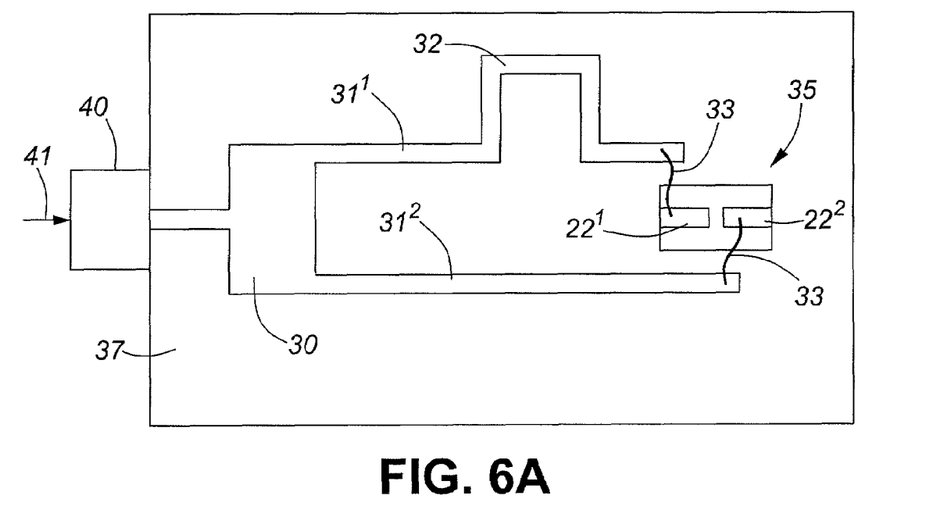
FIGS. 6a-6c are schematic illustrations of a multiple electrode section laser chip on a carrier, according to the present invention.

The power splitter 30 connects the driver circuit 40 to the electrode sections $22^1$ and $22^2$ via respective transmission lines $31^1$, $31^2$ on the same carrier 37 as the laser chip 35. A Suitable commercial driver is the Vitesse 7984 by Vitesse Semiconductor Corporation, which can be used for both single sided and differential drive. The transmission lines $31^1$, $31^2$ are connected to the electrode sections $22^1$ and $22^2$ by wire bonds $33^1$, $33^2$. The wire bonds $33^1$, $33^2$ are part of the electrical drive circuit, and in some embodiments of the invention they may be of different designs, and so play a role in producing the difference between the drive signals to the two electrode sections, for example different lengths of wire bonds can be used to produce part or all of the time delay between the two drive signals.

The power splitter 30 may split the voltage waveform from the laser driver 40 into identical voltage waveforms that are used to drive the different sections of the laser, with the amplitude of each voltage being reduced proportionately with the number of electrode sections. Alternatively the power splitter 30 may split the driver waveform unequally. In a further embodiment the transmission lines $31^1$, $31^2$ may be driven by a differential driver 40, as shown in FIG. 6b, and an RF attenuator 34 may be inserted into the circuit elements on the ceramic carrier 37.

Figure 6B:
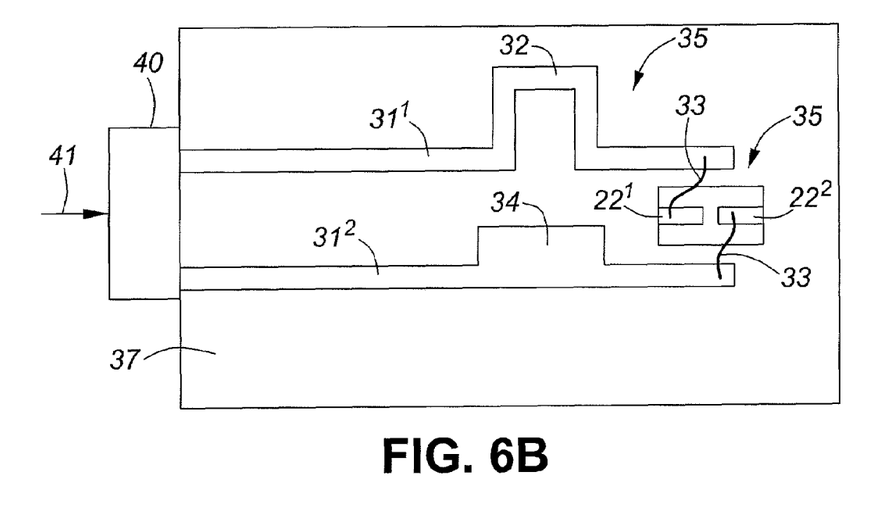
Figure 6C:
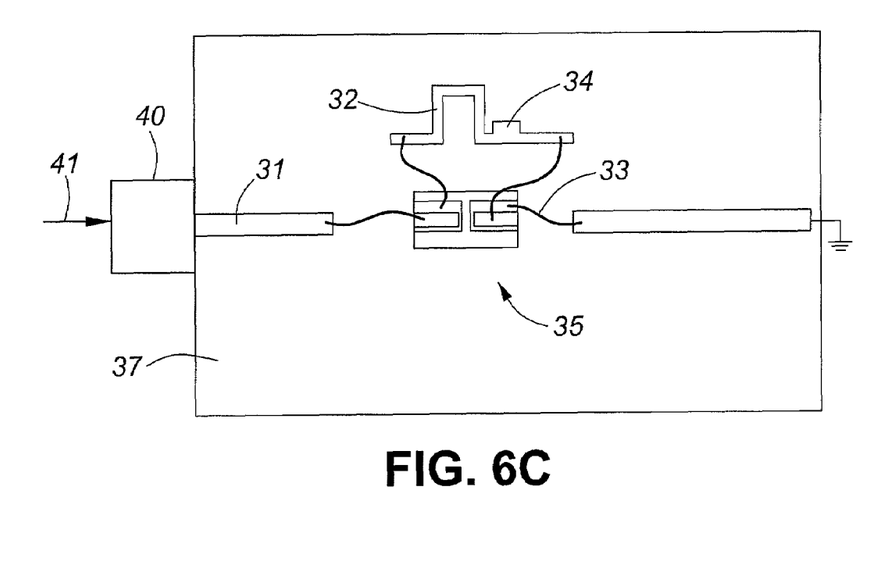

In a yet further embodiment, shown in FIG. 6c, the laser sections may be connected in series, with a connection between the electrode sections comprising circuit elements on the ceramic carrier 37. Advantageously, in this configuration of the laser chip the laser sections should be electrically isolated, with both electrodes comprising an electrode section corresponding with each section of the laser, and such that both the cathode and the anode electrode sections of each section are accessible from the top of the laser chip.

In further embodiments, some or all of the circuit elements illustrated in FIGS. 6a to 6c may be provided on the laser chip. The parts of the device may all have the same epitaxial structure. One of the advantages of the invention is that by using extra chip electrodes and including some extra tracking on existing components as passive built-in elements, it is possible to improve the performance of the device without a substantial increase in manufacturability or cost.

The role of the delay line 32 is to set the amount of time delay between the two drive signals applied to the laser. One method to realize such a delay is to have transmission lines of different length. Typically, on a ceramic carrier for a laser modulated at 10 Gbit/s, the differential path length may be approximately 4 mm.

While the delay is fixed during operation of the device, it may be desirable to provide a control for setting the delay in order to compensate for manufacturing variations between chips. Such a control could be implemented as a settable delay in a circuit that is external to the chip and carrier, for example as part of a module within which the chip and carried are incorporated.

As well as application to DMLs, it will be obvious to one skilled in the art that his invention may be applicable with direct modulation of other resonant cavity optoelectronic devices, such as some light emitting diodes.

We claim:

1. A method of producing an amplitude modulated optical output signal from a directly modulated resonant cavity optoelectronic device divided into successive sections, comprising:
    applying respective electrical drive signals derived from a common input signal to said successive sections to produce components of the optical output signal, said sections being biased above a lasing threshold for the device; and
    the electrical drive signals having overlapping waveforms with a time delay introduced therebetween such that the components of the optical output signal reach a peak intensity at different times to suppress amplitude overshoot and/or amplitude oscillation during transitions between a low and a high output level.

2. The method of claim 1, wherein said time delay is fixed during operation of the method.

3. The method of claim 1, wherein the optoelectronic device has an electrode divided into at least two separate electrode sections, and the respective electrical drive signals are applied to each said electrode section, and wherein the electrical drive signals are applied between each said respective electrode section and a common ground electrode.

4. The method of claim 3, wherein the electrical drive signals applied to said electrode sections have identical waveforms with said time delay introduced between them.

5. The method of claim 3, wherein the electrical drive signals applied to said electrode sections have different amplitudes, and the different amplitudes of the drive signals are achieved by shaping said at least two electrode sections differently.

6. The method of claim 3, wherein the electrical drive signals are generated by creating multiple waveforms from the common input signal and introducing the time delay between the multiple waveforms.

7. The method of claim 3, further comprising a plurality of said electrode sections electrically connected in series with an RF circuit element inserted between said electrode sections, and wherein said RF circuit element delays the electrical drive signal applied to the previous said electrode section.

8. The method of claim 7, wherein the RF circuit element further attenuates the electrical waveform between said electrode sections.

9. The method of claim 3, wherein said delay is a fraction of a bit period of said optical signal.

10. The method of claim 3, wherein said electrical drive signals are in the form of a digital electrical waveform and the modulation rate is at least 1 Gbit/s.

11. A direct modulation resonant cavity optoelectronic device, comprising:
    an optically active region;
    an electrode divided into at least two separate electrode sections for applying respective electrical drive signals derived from a common input signal to said optically active region; and
    a drive arrangement configured to apply said electrical drive signals with overlapping waveforms to said at least two electrode sections, said overlapping waveforms having a time delay therebetween such that the components of the optical output resulting from the waveform applied to each electrode section reach a peak intensity at different times to suppress amplitude overshoot and/or amplitude oscillation during transitions between a low and a high output level.

12. The device of claim 11 wherein said drive arrangement is configured to apply a fixed time delay during operation of the device.

13. The device of claim 12, further comprising a common ground electrode, and wherein said drive arrangement is configured to apply said electrical drive signals between said respective electrode sections and said common ground electrode.

14. The device of claim 11, wherein said drive arrangement comprises an electrical waveform generator and a delay element for creating a delayed version of the waveform produced by said electrical waveform generator to provide said drive signals.

15. The device of claim 14, wherein said electrical waveform generator produces differential outputs, and said delay element introduces a delay between said differential outputs.

16. The device of claim 14, wherein said delay element is fabricated on a common carrier with a chip providing said device, and wherein said electrical waveform generator produces a single output, a power splitter is provided to produce multiple versions of said single output, and at least one said delay element is provided to introduce a delay between said multiple versions.

17. The device of claim 16, wherein said power splitter and said delay element are provided on a common carrier with a chip providing said resonant cavity optoelectronic device.

18. The device of claim 11, wherein said separate electrode sections are connected in a series chain, said driver arrangement is connected to one end of said chain, and a delay element is provided between said electrode sections.

19. The device of claim 11, wherein said device is selected from the group consisting of: a Fabry-Perot laser diode and a direct modulated laser.

20. The device of claim 12, wherein one of said electrode sections is narrower than the other of said electrode sections.

21. The device of claim 12, wherein said electrode sections have characteristics selected from the group consisting of: the electrode sections having different shapes; at least one of said electrode sections having a comb-like shape; and at least one of said electrode sections having a series of holes.

22. The device of claim 11, wherein said drive arrangement is connected to said electrode sections via respective transmission lines configured to introduce said delay between the electrical drive signals applied to the respective electrode sections.

23. The device of claim 22, wherein said delay is introduced by bonding wires connecting the respective transmission lines to the respective electrode sections.

24. A direct modulation laser comprising:
   a carrier;
   a laser chip provided on said carrier, said laser chip including an electrode divided into at least two separate electrode sections for applying respective electrical drive signals derived from a common input signal to an active region of the laser to generate components of an optical output;
   transmission lines on said carrier for applying the electrical drive signals to said respective electrode sections; and
   said transmission lines being configured to introduce a time delay between the electrical drive signal applied to one of said electrode sections and the electrical drive signal applied to the other of said electrode sections whereby the components of the optical output resulting from the drive signal applied to each section reach a peak intensity at different times to suppress amplitude overshoot and/or amplitude oscillation during transitions between a low and a high output level.

25. The direct modulation laser of claim 24, wherein a delay element is included in at least one of said transmission lines to introduce said delay.

26. The direct modulation laser of claim 25, further comprising a power splitter on said carrier for dividing an applied digital electrical waveform providing said input signal into multiple versions thereof to form said electrical drive signals.

27. The direct modulation laser of claim 24 further comprising an attenuator on said carrier in one of said transmission lines so that said respective drive signals have different amplitudes.

28. The direct modulation laser of claim 24, wherein said electrode sections are connected in series with a delay element therebetween, whereby a delayed version of the electrical drive signal applied to one of said electrode sections is applied to the other of said electrode sections.

29. The direct modulation laser of claim 28, further comprising an attenuator between said electrode sections connected in series so that said respective drive signals have different amplitudes.

30. The direct modulation laser of claim 24, wherein the delay is a fraction of a bit period.

\* \* \* \* \*